(12) United States Patent
Chiang

(10) Patent No.: US 7,508,070 B2
(45) Date of Patent: Mar. 24, 2009

(54) TWO DIMENSIONAL STACKING USING INTERPOSERS

(76) Inventor: Cheng-Lien Chiang, 4Th Floor, #98, Lane 85, Lin-Sen North Road, Taipei 104 (TW)

( * ) Notice: Subject to any disclaimer, the term of this patent is extended or adjusted under 35 U.S.C. 154(b) by 293 days.

(21) Appl. No.: 11/623,075

(22) Filed: Jan. 13, 2007

(65) Prior Publication Data

US 2008/0169543 A1    Jul. 17, 2008

(51) Int. Cl.
*H01L 23/34* (2006.01)
*H01L 23/02* (2006.01)

(52) U.S. Cl. .................... 257/723; 257/686; 257/777; 257/E23.141

(58) Field of Classification Search .............. 257/723, 257/686, 777, E23.141
See application file for complete search history.

(56) References Cited

U.S. PATENT DOCUMENTS

| | | | | |
|---|---|---|---|---|
| 5,854,534 A * | 12/1998 | Beilin et al. | ................. | 257/691 |
| 5,869,896 A * | 2/1999 | Baker et al. | .................. | 257/724 |
| 6,239,496 B1 * | 5/2001 | Asada | ........................ | 257/777 |
| 6,538,895 B2 * | 3/2003 | Worz et al. | .................... | 361/735 |
| 6,576,992 B1 * | 6/2003 | Cady et al. | .................. | 257/686 |
| 7,282,793 B2 * | 10/2007 | Akram | ........................ | 257/686 |
| 7,446,404 B2 * | 11/2008 | Huang et al. | ................ | 257/686 |
| 2002/0017719 A1 * | 2/2002 | Taniguchi et al. | ............ | 257/723 |
| 2002/0061665 A1 * | 5/2002 | Batinovich | ................... | 439/71 |
| 2003/0122247 A1 * | 7/2003 | Joshi | ........................... | 257/723 |
| 2006/0055024 A1 * | 3/2006 | Wehrly | ........................ | 257/693 |

* cited by examiner

*Primary Examiner*—Nitin Parekh
(74) *Attorney, Agent, or Firm*—CKC & Partners Co., Ltd.

(57) ABSTRACT

A two dimensional stacking structure for integrated chip stacking on a printed circuit board having a controller electrically coupling on the printed circuit board, comprising a first integrated circuit package, a second integrated circuit package and two interposers. The first integrated circuit package is located beside the controller and electrically coupled on the printed circuit board, and has first leads. The second integrated circuit package is located on the controller, and has second leads. The two interposers having first metal contacts attaching to the corresponding first leads, second metal contacts attaching to the corresponding second leads, and circuit traces extending from the first metal contacts to the corresponding second metal contacts providing electrical communication between the first integrated circuit package and the second integrated package. The two dimensional stacking structure may be applied to a circuit module to decrease the profile of the circuit module.

19 Claims, 6 Drawing Sheets

TWO DIMENSIONAL STACKING USING INTERPOSERS

BACKGROUND

1. Field of Invention

The present invention relates to two dimensional stacking of integrated circuit packages. More particularly, the present invention relates to two dimensional stacking of integrated circuit packages using interposers.

2. Description of Related Art

Demands for high-density boards in microprocessor systems have created many challenges to the board assembly process. Three dimensional stacking of integrated circuit devices were introduced to stack multiple devices on top of each other on the printed circuit board to save horizontal board space. Among several three dimensional stacking method, many attempts to reduce the gap between the devices to minimize the height of the stacked configuration. Take the stacking of thin small outline packages (TSOP) as an example, to reduce the height of stack, interposers were used as contact members. Please refer to FIG. 1, illustrating a three dimensional stacked device 100 with interposers 110. The interposers 110 are located between the individual packages leads 120. This configuration is an improvement from inserting a single slab of printed circuit board in between the packages introducing extra height to the stack.

However, the profile of the circuit modules using three dimensional stacking with interposers is still too thick for the thinner-is-better consumer market today. Modules such as multi media cards (MMC) and secure digital (SC) cards demands a reduction in thickness, yet without expansion in the horizontal space. Unless the profile of the integrated circuit packages can be reduced, the height of three dimensional stacking cannot be reduced significantly even if no gap exists between the packages.

Therefore, a new stacking model is needed to significantly reduce the profile of the circuit modules, such as MMC and SD cards, while maintaining the same horizontal board space of the modules.

SUMMARY

The present invention is directed to a two dimensional stacking structure, that is satisfies this need of reducing the profile of the circuit module while maintaining the same horizontal board space of the modules. The two dimensional structure comprises of placing two integrated circuit package horizontally side by side with each other and use interposers to establish electrical communication between the integrated circuit packages. The metal contacts of the interposers are attached to the corresponding leads of the integrated circuit packages. Circuit traces within the interposers connect the corresponding metal contacts together so that the corresponding leads may be electrically connected. The number of integrated circuits packages that may be connected in the horizontal two dimensional fashion is not limited. The shape of the interposers may vary according to the placement of the integrated circuit packages.

The present invention also provides a circuit module, such as a MMC or a SD card, that utilizes the two dimensional stacking structure. The circuit module includes a printed circuit board having contacts leads for integrated circuit package attachment and a memory controller such as a flash controller to control the memory chips; a first integrated circuit package soldered onto the printed circuit board; a second integrated circuit package placed near the first integrated circuit package on the same horizontal plain and on top of the memory controller; and one strip of interposer with metal contacts is attached to the first row of leads of the first and second integrated circuit packages, another strip of interposer is attached to the second row of leads of the first and second integrated circuit packages. The interposers electrically connect the corresponding leads of the first integrated circuit package and the second integrated circuit package.

The circuit module of the present invention eliminated a thickness of one integrated circuit package in the total thickness of the module. If the integrated circuit packages are stacked on top of each other, the total thickness of the module is approximately the combined thickness of the printed circuit board, two integrated circuit packages and an interposer. The total thickness of the horizontally stacked module is approximately the combined thickness of the printed circuit board, one integrated circuit package and an interposer. Since the second integrated circuit package is placed on top of the memory controller preoccupied area, no additional board space is needed to accommodate the second integrated circuit package placement. Therefore, the profile of the circuit module is reduced significantly while no extra board space is required on the printed circuit board.

It is to be understood that both the foregoing general description and the following detailed description are by examples, and are intended to provide further explanation of the invention as claimed.

BRIEF DESCRIPTION OF THE DRAWINGS

These and other features, aspects, and advantages of the present invention will become better understood with regard to the following description, appended claims, and accompanying drawings where:

DESCRIPTION OF THE PREFERRED EMBODIMENTS

Figure 1:
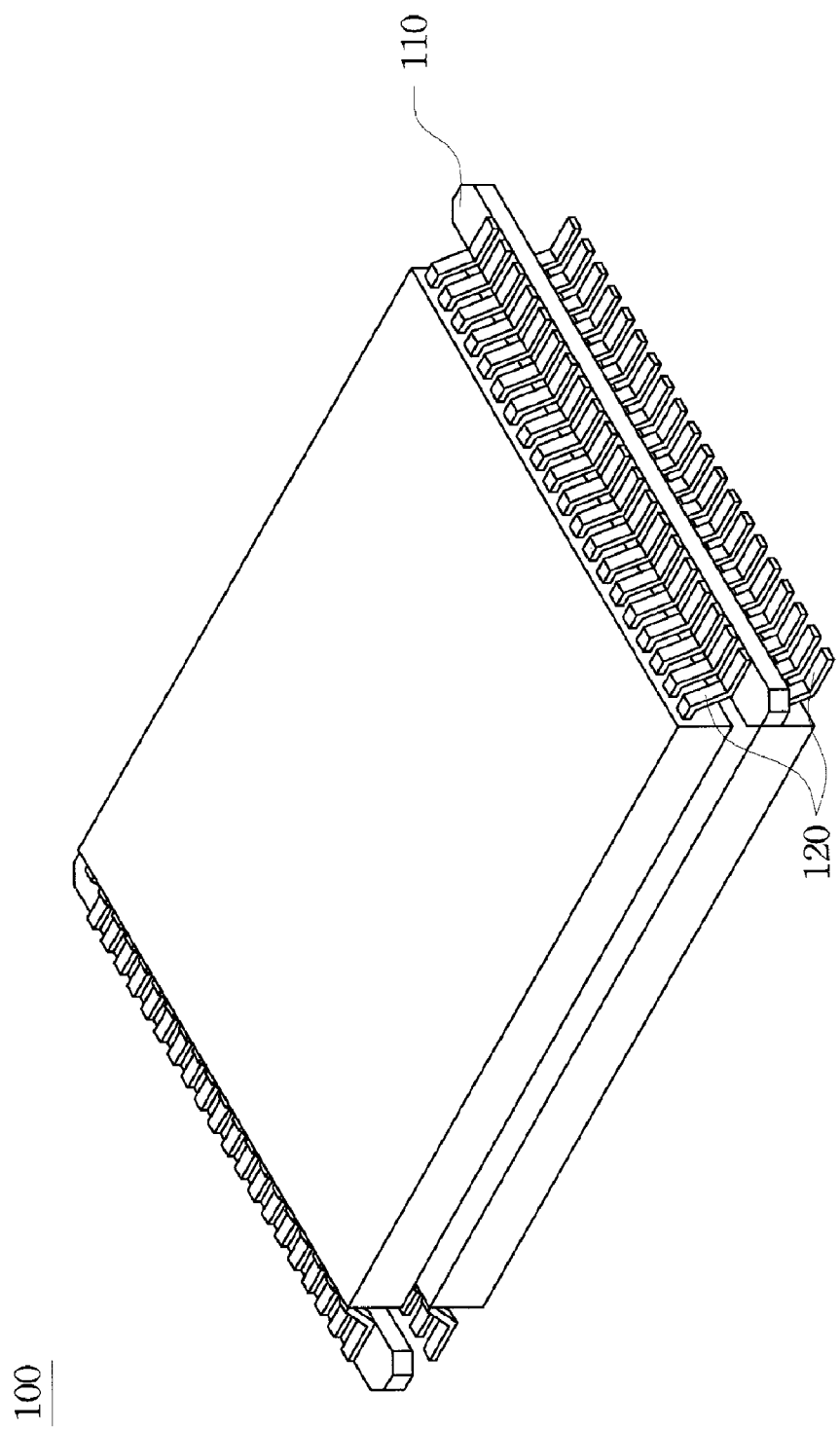
FIG. 1 is a three dimensional stack device with interposers.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
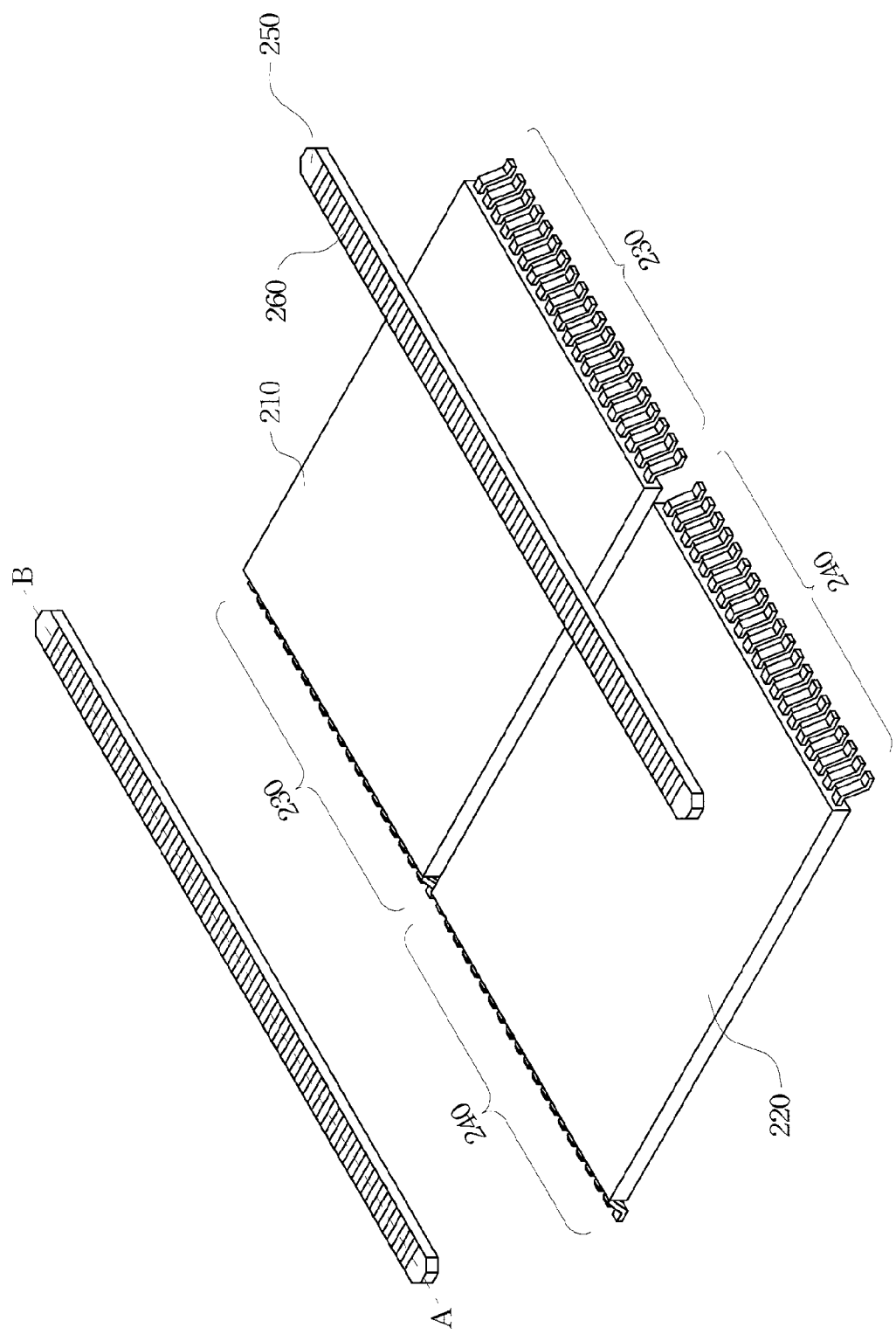
FIG. 2A is an exploded view of the two dimensional stacking structure according to the first embodiment of this invention.
Figure 2B:
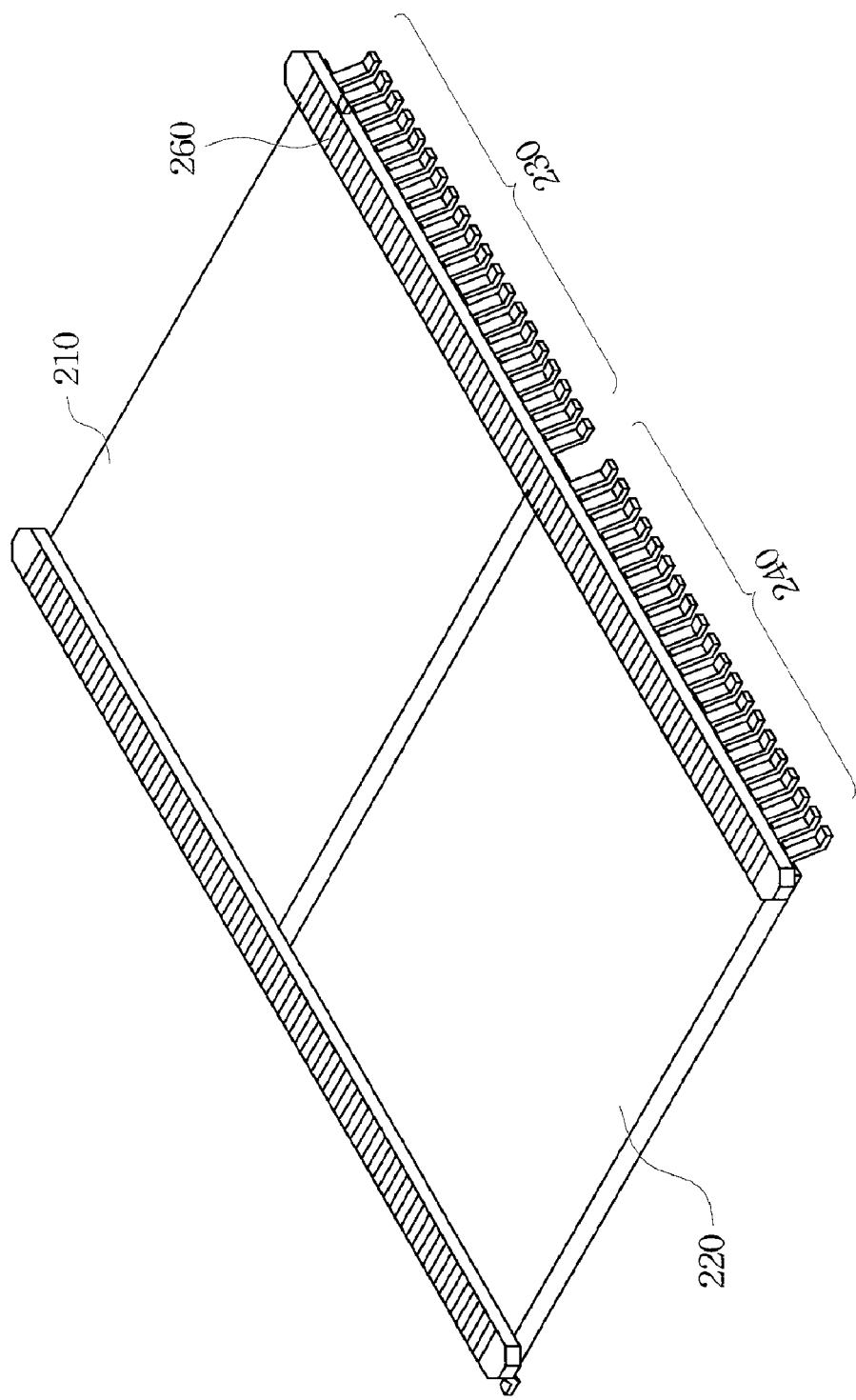
FIG. 2B is an assembled view of the two dimensional stacking structure according to the first embodiment of this invention.

Please refer to FIG. 2A and FIG. 2B simultaneously. FIG. 2A is an exploded view of the two dimensional stacking structure according to the first embodiment of the present invention. The stacking structure 200 is used for stacking integrated circuit packages, such as DRAM chips, NAND flash chips, NOR flash chips or MRAM chips on printed circuit boards. The first integrated circuit package 210 and the second integrated circuit package 220 are placed side by side on the same horizontal plain with each other. The leads 230 of the first integrated circuit package and the leads 240 of the second integrated circuit package are aligned in a straight line, so that the edges of the integrated circuit packages 210 and 220 are aligned. The integrated circuit packages 210 and 220 are TSOP, but may also be ball grid array (BGA) packages (not shown). Interposers 250 having metal contacts 260 are placed on top of the leads 230 and leads 240. The metal contacts 260 are soldered onto the corresponding leads 230 and leads 240 as in FIG. 2B. The relative position of the first integrated circuit package 210 with the second integrated circuit package 220 are in the above arrangement to fit the circuit modules such as a MMC or a SD card, wherein the first integrated circuit package 210 may be placed beside a controller chip on a printed circuit board, and thus the second integrated package 220 is on top of the controller. However, the relative position of the integrated circuit packages 210 and 220 may vary for other circuit modules. Similarly, the shape of the interposers 250 corresponds to the placement of the integrated circuit module to match the leads configuration.

Figure 3:
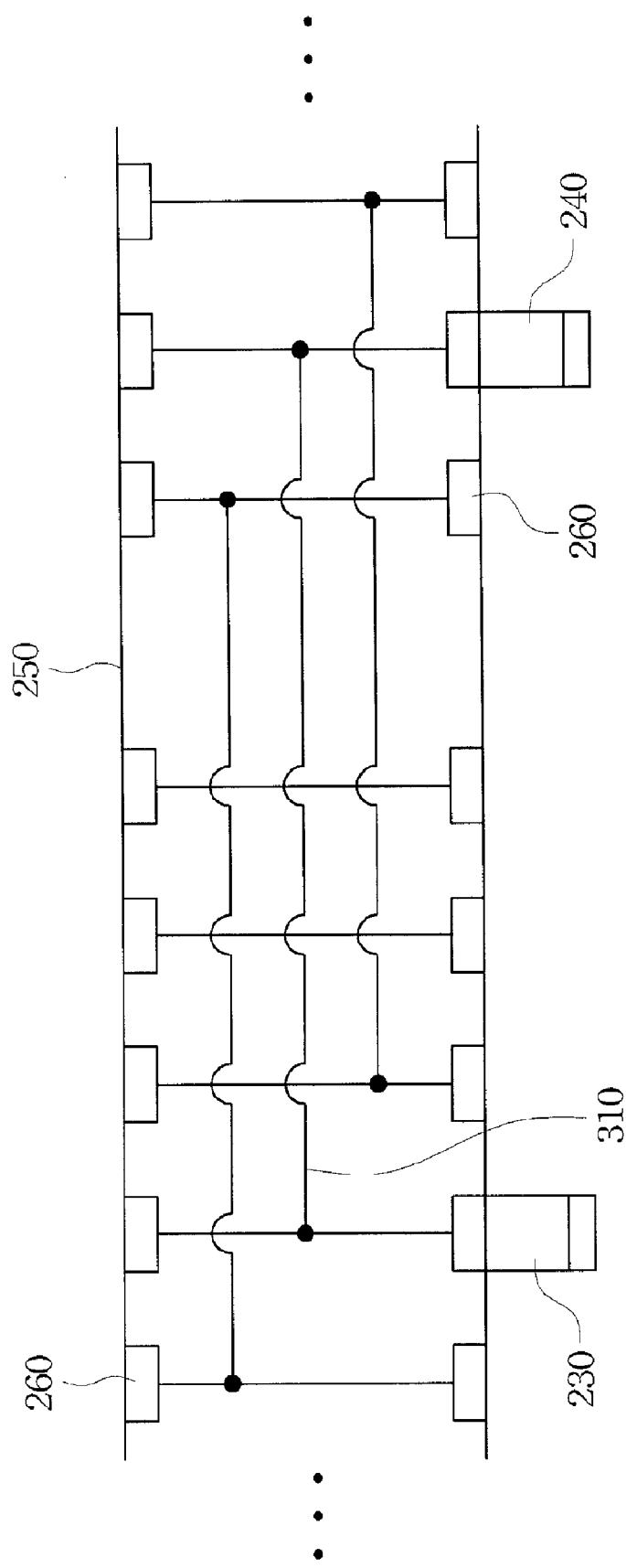
FIG. 3 is an exemplary cross section view of the interposer.

Please refer to FIG. 3, an exemplary cross section view of the interposer 250 along line AB in FIG. 2A. The corresponding metal contacts 260 are connected together via circuit traces 310 so that the leads 230 couple to the corresponding leads 240. Therefore, the interposers 250, when attached to the integrated circuit packages 210 and 220, establish electrical communication between the integrated circuit packages 210 and 220. The circuit traces 310 may be laminated within the interposer 250. The routing pattern of the circuit trace 310 shown is FIG. 3 is an example, and may vary for different circuit applications.

Figure 4A:
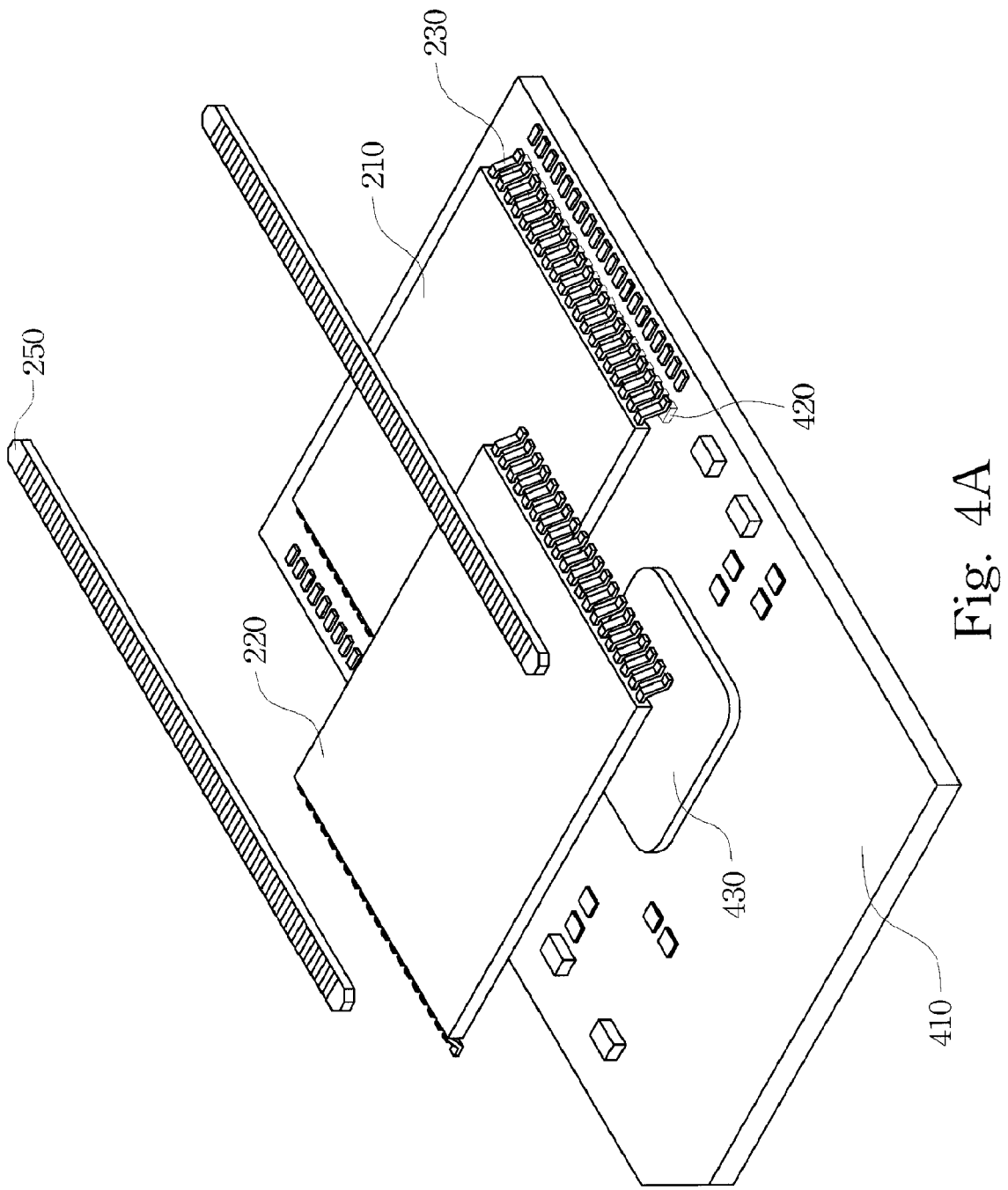
FIG. 4A is an exploded view of a circuit module having the two dimensional stacking structure.
Figure 4B:
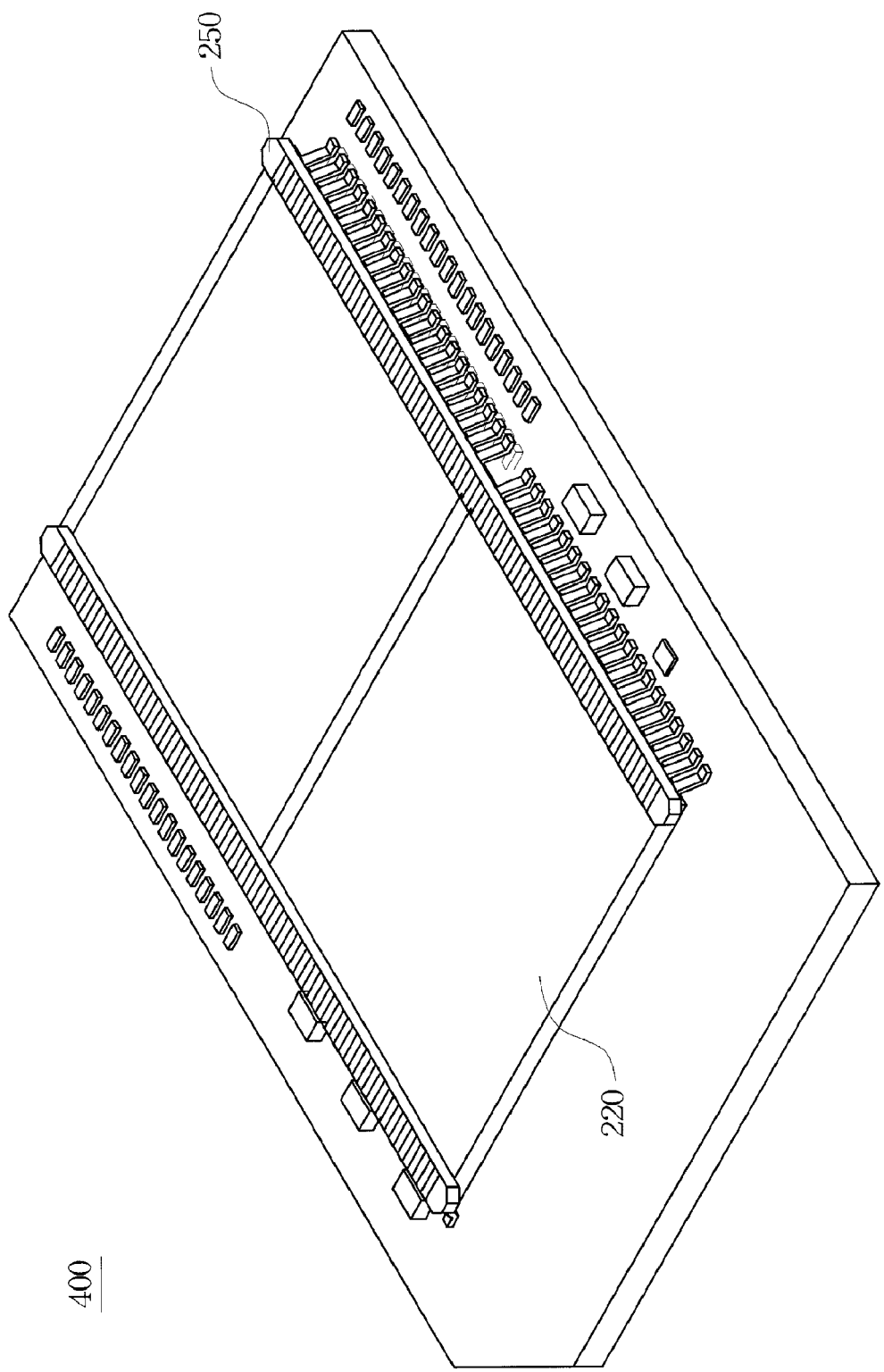
FIG. 4B is an assembled view of the circuit module having the two dimensional stacking structure.

Please refer to FIG. 4A and FIG. 4B simultaneously. FIG. 4A is an exploded view of a circuit module, such as a MMC or a SD card, having the two dimensional stacking of memory integrated circuit packages. The printed circuit board 410 has contact leads 420 for attaching memory chips to the printed circuit board 410. The printed circuit board 410 also has a memory controller 430, such as a flash controller, to control the memory chips. The flash controller occupies an area on the printed circuit board next to the memory chips attachment area. A memory chip, such as the integrated circuit package 210 is attached to the printed circuit board 410 by soldering the leads 230 against the contact leads 420. A second memory chip, such as the integrated circuit package 220 is placed next to the first integrated circuit package 210 and on top of the memory controller 430. The interposer 250 is attached to the leads 230 and 240 forming the two dimensionally stacked circuit module 400 as in FIG. 4B. The integrated circuit package 220 is fixed on top of the memory controller by the interposer 250 and occupies the existing printed circuit board surface area. An insulation layer (not shown) may be inserted between the second integrated package 220 and the memory controller. The insulation layer may be an adhesive layer or a thermal dissipation layer to provide structural support, device isolation and thermal dissipation. The integrated circuit package 220 is in electrical communication with the integrated circuit package 210 via the interposer 250 described above. The integrated circuit packages 210 and 220 are also in electrical communication with the printed circuit board via soldering of the leads 230 and contact lead 420.

The present invention allows the integrated circuit packages to be stacked in the horizontal direction reducing the profile of the circuit module. The two dimensional stacking structure disclosed by the present invention requires no additional board space as long as the integrated circuit packages may be placed on top of the existing circuitry on the printed circuit board.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A stacking structure for integrated chip stacking on a printed circuit board having a controller electrically coupling on the printed circuit board, comprising:
   a first integrated circuit package located beside the controller and electrically coupling on the printed circuit board, the first integrated circuit package having a plurality of first leads;
   a second integrated circuit package located on the controller, the second integrated circuit package having a plurality of second leads; and
   two interposers having a plurality of first metal contacts attaching to the corresponding first leads, a plurality of second metal contacts attaching to the corresponding second leads, and a plurality of circuit traces extending from the first metal contacts to the corresponding second metal contacts providing electrical communication between the first integrated circuit package and the second integrated package.

2. The stacking structure of claim 1, wherein the first integrated circuit package and the second integrated circuit package are thin small outline packages.

3. The stacking structure of claim 1, wherein the first integrated circuit package and the second integrated circuit package are ball grid array packages.

4. The stacking structure of claim 1, wherein the circuit traces are laminated within the interposer.

5. The stacking structure of claim 1, wherein the first integrated circuit package and the second integrated circuit package are memory chips.

6. The stacking structure of claim 5, wherein memory chips are selected from the group consisting of DRAM chips, NAND flash chips, NOR flash chips and MRAM chips.

7. The stacking structure of claim 1, wherein the controller controls the first integrated circuit package and the second integrated circuit package.

8. The stacking structure of claim 1, further comprising an insulation layer between the second integrated circuit package and the controller.

9. The stacking structure of claim 8, wherein the insulation layer is an adhesive layer or a thermal dissipation layer.

10. A module, comprising:
    a printed circuit board having a plurality of contact leads on a side of the printed circuit board, and a semiconductor device attached to the side of the printed circuit board; and
    a stacked package comprising:
      a first integrated circuit package located beside the semiconductor device and electrically coupling on the printed circuit board, the first integrated circuit package having a plurality of first leads;
      a second integrated circuit package located on the semiconductor device, the second integrated circuit package having a plurality of second leads; and
      two interposers having a plurality of first metal contacts attaching to the corresponding first leads, a plurality of second metal contacts attaching to the corresponding second leads, and a plurality of circuit traces extending from the first metal contacts to the corresponding second metal contacts providing electrical communication between the first integrated circuit package and the second integrated package.

11. The module of claim 10, wherein the first integrated circuit package and the second integrated circuit package are thin small outline packages.

12. The module of claim 10, wherein the first integrated circuit package and the second integrated circuit package are ball grid array packages.

13. The module of claim 10, wherein the circuit traces are laminated within the interposer.

14. The module of claim 10, wherein the printed circuit board is a multi media card (MMC) printed circuit board.

15. The module of claim 10, wherein the printed circuit board is a secure digital (SD) card printed circuit board.

16. The module of claim 10, wherein the semiconductor device is a memory controller.

17. The module of claim 16, wherein the memory controller controls the first integrated circuit package and the second integrated circuit package.

18. The module of claim 10, further comprising an insulation layer between the second integrated circuit package and the controller.

19. The module of claim 18, wherein the insulation layer is an adhesive layer or a thermal dissipation layer.

* * * * *